(12) United States Patent
Park et al.

(10) Patent No.: US 11,566,763 B2
(45) Date of Patent: Jan. 31, 2023

(54) LIGHTING DEVICE

(71) Applicant: LG INNOTEK CO., LTD., Seoul (KR)

(72) Inventors: Hoon Park, Seoul (KR); Sa Rum Han, Seoul (KR); Jung Ju Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 17/746,036

(22) Filed: May 17, 2022

(65) Prior Publication Data

US 2022/0275920 A1    Sep. 1, 2022

Related U.S. Application Data

(63) Continuation of application No. 17/422,231, filed as application No. PCT/KR2020/001150 on Jan. 23, 2020, now Pat. No. 11,359,786.

(30) Foreign Application Priority Data

Jan. 24, 2019 (KR) ........................ 10-2019-0009432

(51) Int. Cl.
*F21S 41/176* (2018.01)
*F21S 41/20* (2018.01)
*F21S 41/25* (2018.01)

(52) U.S. Cl.
CPC ............. *F21S 41/176* (2018.01); *F21S 41/25* (2018.01); *F21S 41/285* (2018.01)

(58) Field of Classification Search
None
See application file for complete search history.

(56) References Cited

U.S. PATENT DOCUMENTS

| | | |
|---|---|---|
| 7,651,241 B2 | 1/2010 | Lee |
| 8,698,754 B2 | 4/2014 | Rhyu et al. |
| 8,987,762 B2 | 3/2015 | Nakayama et al. |
| 2009/0212305 A1 | 8/2009 | Harada |
| 2013/0082294 A1 | 4/2013 | Nakayama et al. |
| 2014/0029238 A1 | 1/2014 | Ito et al. |
| 2014/0043850 A1 | 2/2014 | Thompson et al. |
| 2014/0333873 A1 | 11/2014 | Hyung et al. |

(Continued)

FOREIGN PATENT DOCUMENTS

| | | |
|---|---|---|
| EP | 2575185 | 4/2013 |
| EP | 2731153 | 5/2014 |

(Continued)

OTHER PUBLICATIONS

International Search Report dated May 11, 2020 issued in Application No. PCT/KR2020/001150.

(Continued)

*Primary Examiner* — Elmito Breval
(74) *Attorney, Agent, or Firm* — KED & Associates, LLP

(57) ABSTRACT

A lighting device disclosed in an embodiment of the invention includes a plurality of light sources disposed on a substrate; a resin layer disposed on the substrate and the plurality of light sources; a phosphor layer disposed on the resin layer, and an ink layer disposed on the phosphor layer, wherein the ink layer has a first ink layer and a second ink layer having a height greater than that of the first ink layer with respect to the upper surfaces of the phosphor layer, and it possible to provide a three-dimensional image of the surface.

20 Claims, 7 Drawing Sheets

(56) References Cited

U.S. PATENT DOCUMENTS

| | | |
|---|---|---|
| 2014/0367711 A1 | 12/2014 | Bibl et al. |
| 2015/0048395 A1 | 2/2015 | Vampola et al. |
| 2015/0207043 A1 | 7/2015 | Pfeuffer et al. |
| 2017/0040503 A1 | 2/2017 | Pfeuffer et al. |
| 2018/0294385 A1 | 10/2018 | Vampola et al. |

FOREIGN PATENT DOCUMENTS

| | | |
|---|---|---|
| KR | 10-2008-0001507 | 1/2008 |
| KR | 10-2010-0108044 | 10/2010 |
| KR | 10-2014-0132913 | 11/2014 |
| KR | 10-2018-0028682 | 3/2018 |
| WO | WO 2013/144927 | 10/2013 |
| WO | WO 2014/016299 | 1/2014 |

OTHER PUBLICATIONS

European Search Report dated Sep. 27, 2022 issued in Application No. 20745546.0.

LIGHTING DEVICE

CROSS-REFERENCE TO RELATED PATENT APPLICATIONS

This application is a Continuation of U.S. application Ser. No. 17/422,231, filed Jul. 12, 2021, which is a U.S. National Stage Application under 35 U.S.C. § 371 of PCT Application No. PCT/KR2020/001150, filed Jan. 23, 2020, which claims priority to Korean Patent Application No. 10-2019-0009432, filed Jan. 24, 2019, whose entire disclosures are hereby incorporated by reference.

TECHNICAL FIELD

An embodiment of the invention relates to a lighting device for surface light emitting for improving aesthetics.

BACKGROUND ART

In general, a light emitting device, for example, a light emitting diode (LED), has advantages such as low power consumption, semi-permanent life, fast response speed, safety, and environmental friendliness compared to conventional light sources such as fluorescent lamps and incandescent lamps. Such light emitting diodes are being applied to various lighting devices such as various display devices, indoor lights or outdoor lights. Recently, as a light source for a vehicle, a lamp employing a light emitting device has been proposed. Compared with an incandescent lamp, the light emitting element is advantageous in that power consumption is small. Since the light emitting device is small in size, it can increase the design freedom of the lamp and it is economical due to its semi-permanent life. A lighting device of a surface light source is used as the vehicle lighting device, thereby providing a three-dimensional effect and a unique aesthetic feeling of the vehicle lamp. In a conventional lighting device for a vehicle, the texture or feeling of rubber or plastic is strong in the exterior of the product in an unillumined state, thereby degrading the aesthetics of the exterior. In addition, the conventional lighting device for a vehicle is a degree that is simply classified according to the depth of color in an unlit state and in a lit state, which causes an accident to a driver who does not recognize this.

DISCLOSURE

Technical Problem

An embodiment of the invention may provide a lighting device for a vehicle for improving the aesthetics of an appearance of a product. An embodiment of the invention may provide a lighting device having a pattern in which a predetermined shape is repeatedly arranged on a surface of at least one of a phosphor layer and an ink layer. An embodiment of the invention may provide a lighting device for a vehicle for improving a safety function. Embodiments of the invention may provide a lighting device capable of implementing various lighting images.

Technical Solution

A lighting device according to an embodiment of the invention includes a substrate; a plurality of light sources disposed on the substrate; a resin layer disposed on the substrate and the plurality of light sources; a phosphor layer disposed on the resin layer; and an ink layer disposed on the phosphor layer, wherein the ink layer may have a first ink layer and a second ink layer having a height greater than that of the first ink layer with respect to upper surface of the phosphor layer.

A lighting device according to an embodiment of the invention includes: a substrate; a plurality of light sources disposed on the substrate; a resin layer disposed on the substrate and the plurality of light sources; a phosphor layer disposed on the resin layer; and an ink layer disposed on the phosphor layer, wherein the ink layer includes a plurality of convex portions and a plurality of concave portions respectively disposed between adjacent convex portions, wherein an upper surface of the convex portion may have a height higher than a bottom height of the concave portion.

A lighting device according to an embodiment of the invention includes: a substrate; a plurality of light sources disposed on the substrate; a resin layer disposed on the substrate and the plurality of light sources; a phosphor layer disposed on the resin layer; and a plurality of ink layers disposed on at least one of an upper surface and a plurality of side surfaces of the phosphor layer, wherein the plurality of ink layers include a first ink layer on the phosphor layer and a second ink layer having a convex portion on the first ink layer, wherein the plurality of ink layers include a plurality of concave portions concave between the plurality of convex portions, and a height of the upper surface of the second ink layer may be disposed higher than the height of the upper surface of the first ink layer.

According to an embodiment of the invention, the height of the first ink layer may be ⅕ or more of the height of the second ink layer. The upper surface of the first ink layer may be parallel to the upper surface of the second ink layer. The first ink layer may include a plurality of ink layers having different heights. The upper surface of the first ink layer may be inclined with respect to the upper surface of the second ink layer. The upper surface of the first ink layer may include a curved surface. The height of the second ink layer may correspond to a thickness of the phosphor layer. The first ink layer may include a first-first ink layer and a first-second ink layer having a height smaller than that of the first-first ink layer with respect to an upper surface of the phosphor layer. Widths of the first-first ink layer, the first-second ink layer, and the second ink layer may be different from each other. By the light emitted from the plurality of light sources, the first ink layer implements a light in a first pattern, and the second ink layer implements a light of a second pattern different from a shape of the first pattern, and When the luminance of light is 10 candela or less, a brightness of a region of the first pattern is brighter than that of the second pattern, and when the luminance of the light is 60 candela or more, the brightness of the region of the first pattern may correspond to a brightness of a region of the second pattern.

Advantageous Effects

The embodiment of the invention has the effect of realizing an image on the exterior of the product when it is not unlighted by forming different heights of the exposed upper surfaces of the ink layers. According to the embodiment of the invention, a three-dimensional image is provided when the light is unlighted due to a difference in height of exposed upper surfaces of the plurality of ink layers, and a three-dimensional effect may be changed to strong or weak according to the luminance level when the light is on. According to an embodiment of the invention, a three-dimensional image may be implemented in the tail mode, and the three-dimensional image is not visible in the stop mode, thereby inducing a driver to drive safely. An embodiment of the invention has an effect that an image may be implemented using three or more colors by forming a plurality of ink layers to have different heights on the upper surface. In an embodiment of the invention, a gradation effect may be implemented in an image by forming an inclined surface on the upper surface of the ink layer.

BEST MODE

Hereinafter, preferred embodiments of the invention will be described in detail with reference to the accompanying drawings. A technical spirit of the invention is not limited to some embodiments to be described, and may be implemented in various other forms, and one or more of the components may be selectively combined and substituted for use within the scope of the technical spirit of the invention. In addition, the terms (including technical and scientific terms) used in the embodiments of the invention, unless specifically defined and described explicitly, may be interpreted in a meaning that may be generally understood by those having ordinary skill in the art to which the invention pertains, and terms that are commonly used such as terms defined in a dictionary should be able to interpret their meanings in consideration of the contextual meaning of the relevant technology. Further, the terms used in the embodiments of the invention are for explaining the embodiments and are not intended to limit the invention. In this specification, the singular forms also may include plural forms unless otherwise specifically stated in a phrase, and in the case in which at least one (or one or more) of A and (and) B, C is stated, it may include one or more of all combinations that may be combined with A, B, and C. In describing the components of the embodiments of the invention, terms such as first, second, A, B, (a), and (b) may be used. Such terms are only for distinguishing the component from other component, and may not be determined by the term by the nature, sequence or procedure etc. of the corresponding constituent element. And when it is described that a component is "connected", "coupled" or "joined" to another component, the description may include not only being directly connected, coupled or joined to the other component but also being "connected", "coupled" or "joined" by another component between the component and the other component. In addition, in the case of being described as being formed or disposed "above (on)" or "below (under)" of each component, the description includes not only when two components are in direct contact with each other, but also when one or more other components are formed or disposed between the two components. In addition, when expressed as "above (on)" or "below (under)", it may refer to a downward direction as well as an upward direction with respect to one element.

Figure 1:
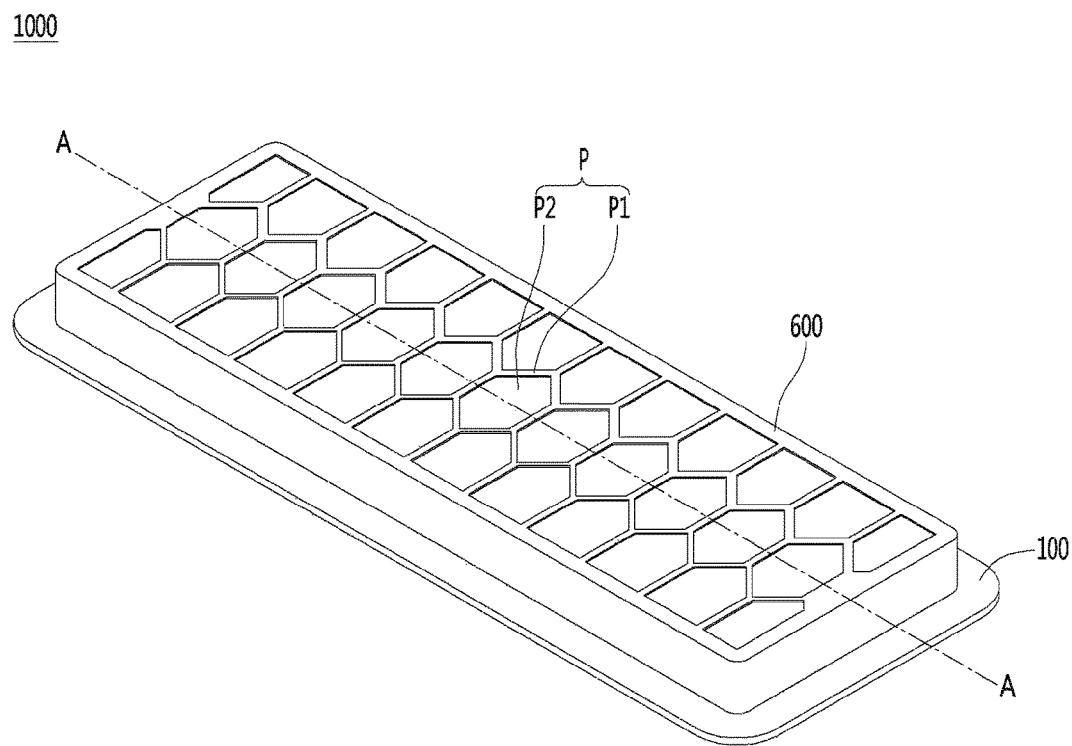
FIG. 1 is a perspective view showing a lighting device according to an embodiment of the invention.
Figure 2:
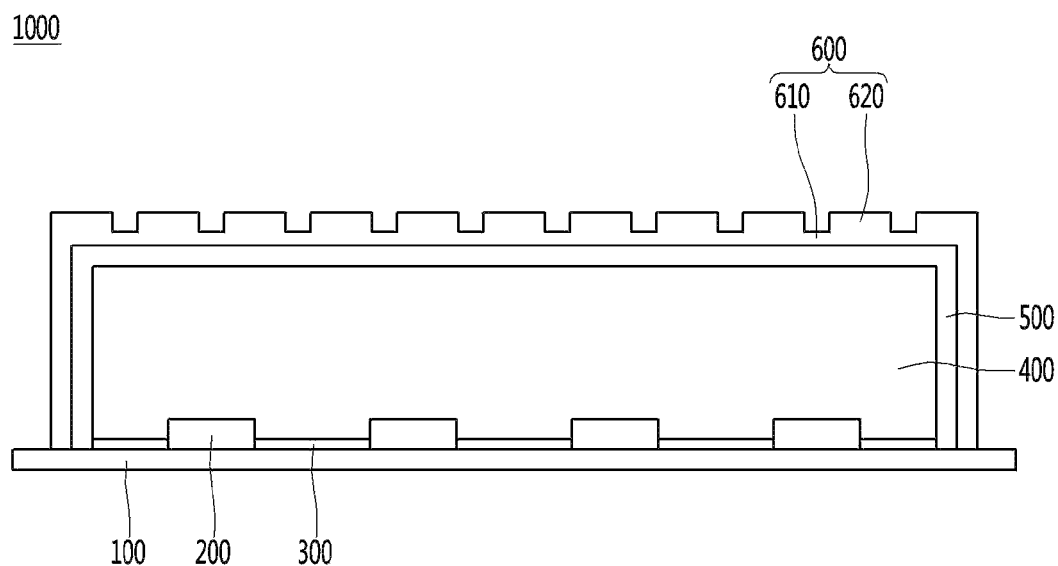
FIG. 2 is a cross-sectional view taken along line A-A of FIG. 1.
Figure 3:
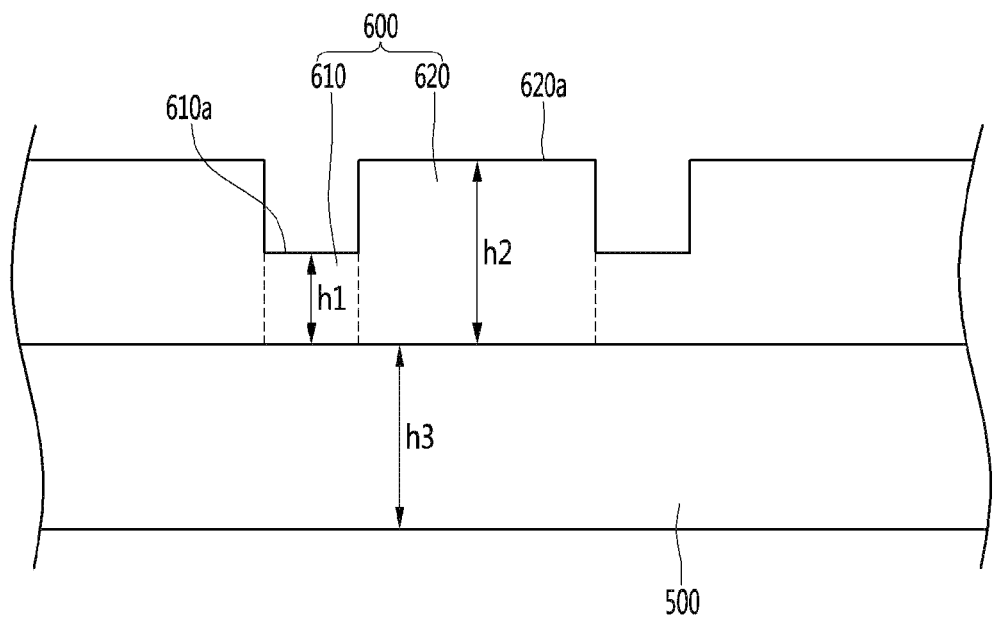
FIG. 3 is an enlarged view showing a portion of an ink layer according to an embodiment of the invention.
Figure 4:
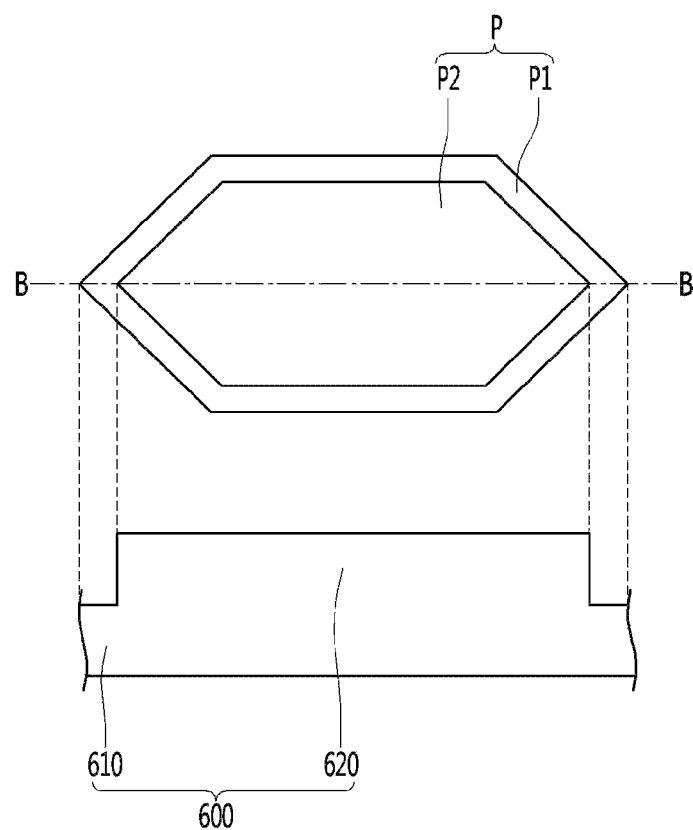
FIGS. 4 and 5 are views showing a plan view and a cross-section of a pattern according to an embodiment of the invention.
Figure 5:
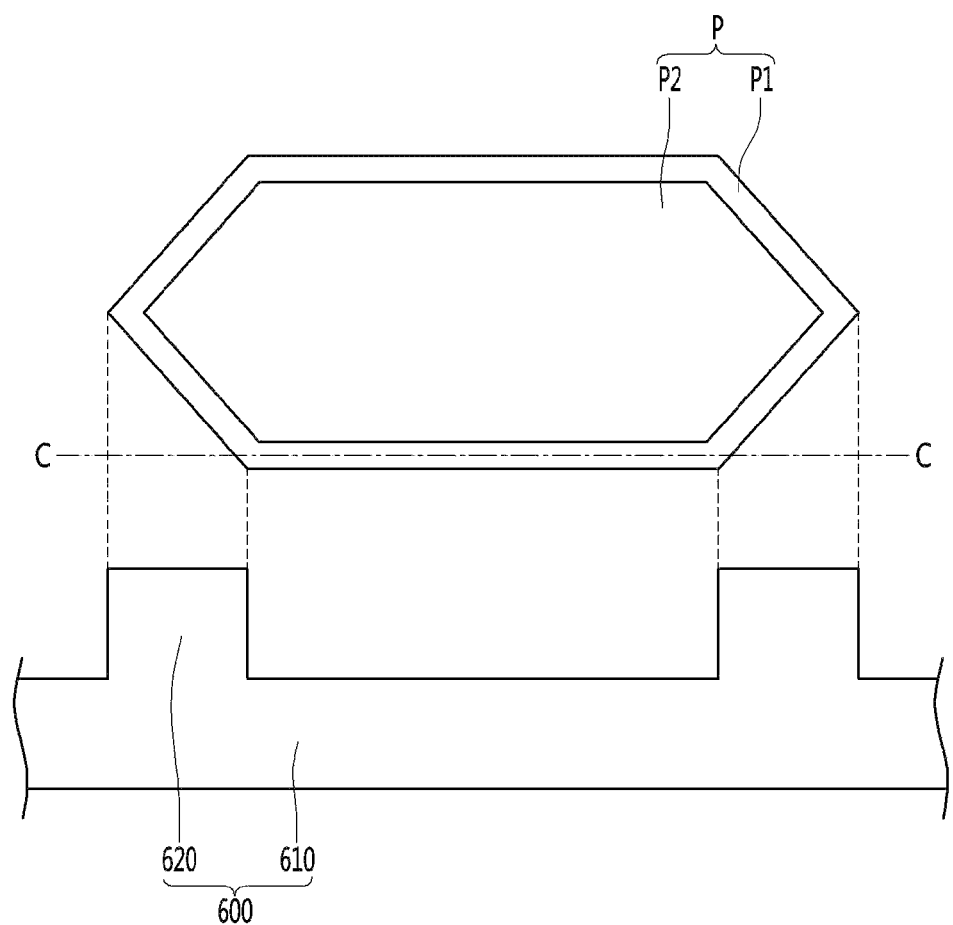

FIG. 1 is a perspective view showing a lighting device according to an embodiment, FIG. 2 is a cross-sectional view taken along line A-A of FIG. 1, FIG. 3 is an enlarged view showing a part of an ink layer according to the embodiment, and FIGS. 4 and 5 are a diagram showing the state of implementing a pattern according to the embodiment.

Referring to FIG. 1, a lighting device 1000 according to an embodiment of the invention may have a three-dimensional shape, for example, at least one surface of which may include a rectangular shape. The lighting device 1000 may be formed in a structure capable of a multi-sided light emission. For example, light may be emitted from four side surfaces and an upper surface of the lighting device 1000. Light may be emitted through the lower portion of the lighting device 1000, and in this case, the substrate 100 may be formed of a transparent material. Although at least one surface of the lighting device 1000 is illustrated in a rectangular shape in the above, the invention is not limited thereto. In addition, the upper surface of the lighting device 100 may be formed in various shapes, such as polygonal or circular shape. In addition, the surface of the lighting device 1000 may be formed in a flat shape or a structure having one or more curved surfaces. The lighting device 1000 may include a plurality of patterns P on an upper portion or an upper surface thereof. The pattern P may include a first pattern P1 and a second pattern P2. The pattern P may implement an image on the exterior of the product with different patterns. The pattern P may be formed on, for example, one side, two sides, or all sides of the lighting device 1000. The first pattern P1 and the second pattern P2 may be alternately disposed in one direction. The second pattern P2 may be alternately disposed or repeatedly disposed between regions in which the first pattern P1 is arranged. The first pattern P1 may be alternately arranged or repeatedly arranged between regions in which the second pattern P2 is arranged. The second pattern P2 may include at least one of a polygonal shape, a circular shape, an elliptical shape, a shape having a curved surface and each surface, an irregular shape, a line shape, and a symbol shape such as a cross shape. An outer edge of the pattern P may be formed of the first pattern P1 and/or the second pattern P2, or may be formed of another pattern. The outer edge may be formed in a continuous line pattern or a discontinuous line pattern, and may be connected to at least one of the first pattern P1 and the second pattern P2.

Referring to FIG. 2, the lighting device 1000 according to the embodiment includes a substrate 100, a plurality of light sources 200 disposed on the substrate 100, and a resin layer 400 disposed on the light sources 200, a phosphor layer 500 disposed on the resin layer 400, and an ink layer 600 disposed on the phosphor layer 500 and having concave and convex portions. The substrate 100 may include an insulating material or a conductive material. The substrate 100 may be formed of a rigid or flexible material. The substrate 100 may be formed of a transparent or opaque material. An electrode pad having a conductive pattern may be formed on one surface of the substrate 100.

As for the light source 200, N light sources 200 may be disposed in a long axis (column) direction of the substrate 100, and M light sources 200 may be disposed in a short axis (row) direction of the substrate 100. The N light sources 200 disposed in the long axis direction of the substrate 100 may be formed to have the same or different separation distances from each other. Similarly, the M light sources 200 disposed in the short axis direction of the substrate 100 may be formed to have the same or different separation distances from each other. The separation distance between the light sources 200 may be appropriately designed to effectively implement the planar light source. The N and M may be two or more, and may be the same as or different from each other.

The light source 200 may include a light emitting device. The light source 200 may emit blue, green, red, white, infrared or ultraviolet light. The light source 200 may emit blue light in a range of, for example, 420 nm to 470 nm. The light source 200 may be provided as a compound semiconductor. The light source 200 may be provided as, for example, a group II-VI or group III-V compound semiconductor. For example, the light source 200 may include at least two or more elements selected from aluminum (Al), gallium (Ga), indium (In), phosphorus (P), arsenic (As), and nitrogen (N). The light source 200 may include a first conductivity type semiconductor layer, an active layer, and a second conductivity type semiconductor layer. The first and second conductivity type semiconductor layers may be implemented with at least one of a group III-V or group II-VI compound semiconductor. The first and second conductivity type semiconductor layers may be formed of, for example, a semiconductor material having a composition formula of $In_xAl_yGa_{1-x-y}N$ ($0 \leq x \leq 1$, $0 \leq y \leq 1$, $0 \leq x+y \leq 1$). For example, the first and second conductivity type semiconductor layers may include at least one selected from the group consisting of GaN, AlGaN, InGaN, InN, InAlGaN, AlInN, AlGaAs, GaP, GaAs, GaAsP, AlGaInP, and the like. The first conductivity type semiconductor layer may be an n-type semiconductor layer doped with an n-type dopant such as Si, Ge, Sn, Se, or Te. The second conductivity type semiconductor layer may be a p-type semiconductor layer doped with a p-type dopant such as Mg, Zn, Ca, Sr, or Ba. The active layer may be implemented with a compound semiconductor. The active layer may be embodied as, for example, at least one of a group III-V or group II-VI compound semiconductor. When the active layer is implemented as a multi-well structure, the active layer may include a plurality of well layers and a plurality of barrier layers that are alternately disposed, and $In_xAl_yGa_{1-x-y}N$ ($0 \leq x \leq 1$, $0 \leq y \leq 1$, $0 \leq x+y \leq 1$). For example, the active layer may include at least one selected from the group consisting of InGaN/GaN, GaN/AlGaN, AlGaN/AlGaN, InGaN/AlGaN, InGaN/InGaN, AlGaAs/GaAs, InGaAs/GaAs, InGaP/GaP, AlInGaP/InGaP, InP/GaAs.

A reflective layer 300 may be further formed on the substrate 100. The reflective layer 300 serves to guide the light generated by the light source 200 upward. The reflective layer 300 may include a white material. The reflective layer 300 may include a resin material. The reflective layer 300 may include silicon, epoxy, or the like. The reflective layer 300 may include a reflective material, for example, $TiO_2$.

The resin layer 400 may be disposed on the substrate 100 and the light source 200. The resin layer 400 may be formed to cover upper surfaces and side surfaces of the plurality of light sources 200. The resin layer 400 may be made of a transparent resin material, for example, a resin material such as UV (ultra violet) resin, silicone, or epoxy. The resin layer 400 may have a thickness of 1 mm to 4 mm. The UV resin may be, for example, a resin (oligomer type) having a urethane acrylate oligomer as a main material as a main material. For example, a urethane acrylate oligomer that is a synthetic oligomer may be used. The main material may further include a monomer mixed with low-boiling dilution-type reactive monomers such as IBOA (isobornyl acrylate), HBA (Hydroxybutyl Acrylate), and HEMA (Hydroxy Metaethyl Acrylate), and as an additive, a photoinitiator (e.g., 1-hydroxycyclohexyl phenyl-ketone, Diphenyl), Diphwnyl (2,4,6-trimethylbenzoyl phosphine oxide), etc. or antioxidants may be mixed. The UV resin may be formed of a composition comprising 10 to 21% of an oligomer, 30 to 63% of a monomer, and 1.5 to 6% of an additive. In this case, the monomer may be composed of a mixture of 10 to 21% of IBOA (isobornyl acrylate), 10 to 21% of HBA (Hydroxybutyl Acrylate), and 10 to 21% of HEMA (Hydroxy Metaethyl Acrylate). The additive may be formed into a mixture capable of improving the yellowing phenomenon by adding 1 to 5% of a photoinitiator to perform a function of initiating photoreactivity, and adding 0.5 to 1% of an antioxidant. Formation of the resin layer 300 using the composition described above is to form a layer with a resin such as UV resin instead of a light guide plate, so that refractive index and thickness may be adjusted, and at the same time, adhesive properties, reliability, and mass production speed of the resin layer using the above-described composition may all be satisfied. The resin layer 400 may further include a dispersing agent (beads or dispersing agent) therein. The diffusing agent may have a spherical shape, and the size thereof may be in the range of 4 μm to 6 μm. The shape and size of the diffusion agent are not limited thereto. In the lighting device, the resin layer 400 may be formed as one layer or may include two or more layers. The resin layer 400 may include a first resin layer that does not contain impurities, and a second resin layer that includes a diffusing agent on the first resin layer. Alternatively, the second resin layer may be formed under the first resin layer.

The phosphor layer 500 may be formed on the resin layer 400. The phosphor layer 500 may be disposed to cover an upper surface and/or a side surface of the resin layer 400. The phosphor layer 500 may be in contact with the surface of the resin layer 400. The phosphor layer 500 may include a transparent material. The phosphor layer 500 may include a transparent insulating material. The phosphor layer 500 may be made of a silicon material, and may be made of a silicon material having different chemical bonds. Silicone is a polymer in which inorganic silicon and organic carbon are combined, and has physical properties such as thermal stability, chemical stability, abrasion resistance, and glossiness of inorganic substances and reactivity, solubility, elasticity, and processability, which are characteristics of organic substances. The silicon may include general silicon and fluorine silicon with an increased fluorine ratio. Increasing the fluorine ratio of fluorinated silicon has an effect of improving moisture resistance. The phosphor layer 500 may include a wavelength conversion means for receiving light emitted from the light source 200 and providing wavelength-converted light. For example, the phosphor layer 500 may include at least one selected from the group consisting of phosphors, quantum dots, and the like. The phosphor or quantum dots may emit blue, green, or red light. The phosphor may be evenly disposed in the phosphor layer 500. The phosphor may include a phosphor of a fluoride-based compound, for example, may include at least one of an MGF-based phosphor, a KSF-based phosphor, or a KTF-based phosphor. The phosphors may emit different peak wavelengths, and the light emitted from the light source 200 may emit different yellow and red or different red peak wavelengths. When the phosphor is a red phosphor, the red phosphor may have a wavelength range of 610 nm to 650 nm, and the wavelength may have a width of less than 10 nm. The red phosphor may include a fluoride-based phosphor. The fluorite-based phosphor may include at least one of KSF-based red $K_2SiF_6:Mn^{4+}$, $K_2TiF_6:Mn^{4+}$, $NaYF_4:Mn^{4+}$, $NaGdF_4:Mn^{4+}$, and $K_3SiF_7:Mn^{4+}$. The KSF-based phosphor, for example, may have a compositional formula of $K_aSi_{1-c}Fb:Mn^{4+}c$, wherein a is 1≤a≤2.5, b is 5≤b≤6.5, and c is 0.001≤c≤0.1. In addition, the fluorite-based red phosphor may be coated with a fluoride not containing Mn, or an organic coating may be further included on the surface of the phosphor or the surface of the fluoride coating not containing Mn to improve reliability at high temperature/high humidity. In the case of the fluoride-based red phosphor as described above, unlike other phosphors, since it may implement a width of 10 nm or less, it may be utilized in high-resolution devices. The phosphor composition according to the embodiment should basically conform to stoichiometry, and each element may be substituted with another element in each group on the periodic table. For example, the Sr may be substituted with Ba, Ca, Mg, etc. of the alkaline earth (II) group, and the Y may be substituted with Tb, Lu, Sc, Gd, etc. of the lanthanide series. In addition, the activator Eu, etc. may be substituted with Ce, Tb, Pr, Er, Yb, etc. according to a desired energy level, and a sub-activator or the like may be additionally applied to the activator alone or to modify properties. The quantum dots may include a group II-VI compound or a group III-V compound semiconductor, and may emit red light. The quantum dots may be, for example, ZnS, ZnSe, ZnTe, CdS, CdSe, CdTe, GaN, GaP, GaAs, GaSb, InP, InAs, In, Sb, AlS, AlP, AlAs, PbS, PbSe, Ge, Si, $CuInS_2$, $CuInSe_2$ and the like, and combination thereof.

The ink layer 600 may be disposed on the phosphor layer 500. The ink layer 600 may include red ink, that is, ink powder. In the ink layer 600, when the light source 200 is not turned on, the outer surface of the lighting device 1000 may be displayed in red. When the light source 200 is lit or not, the ink layer 600 may be displayed in red. Such a lighting device may prevent a sense of heterogeneity due to a color difference of the surface. The ink layer 600 may be formed of a resin material, and red ink may be included in a predetermined weight %. For example, the red ink may include 2 wt % to 10 wt % in the ink layer 600. The ink layer 600 is configured to include, for example, red ink, but may include ink powder of various colors such as other colors, such as yellow or blue. Ink powder having such a color may provide a surface color as an ink color when lighting is lit or not, or reduce a difference in surface colors when lighting is lit or not.

A plurality of ink layers 600 having different heights may be included on the upper surface of the ink layer 600 to implement the pattern P. The ink layers 600 may include a concave portion and a convex portion. The ink layers 600 may include a first ink layer 610 and a second ink layer 620. The first ink layer 610 may be disposed on the phosphor layer 500 or may be in contact with the surface of the phosphor layer 500. The second ink layer 620 may be disposed on the first ink layer 610. The second ink layer 620 may include a pattern having a predetermined shape on the first ink layer 610. The upper surface area of the second ink layer 620 may be smaller than the lower surface area of the first ink layer 610. The first ink layer 610 may include a region having a concave portion. The concave portion may be a groove or a recess formed between the convex portions. The second ink layer 620 may be a region in which a convex portion is formed. The convex portions may be connected to each other or disposed outside the concave portions. A plurality of the concave portions may be arranged or disposed inside the convex portion. The concave portions may be respectively disposed between the plurality of convex portions. The convex portion may have a structure protruding toward the upper surface of the ink layer 600, and the concave portion may have a structure recessed from the upper surface to the lower surface of the ink layer 600. The first ink layer 610 may be a layer for implementing the first pattern P1. The first pattern P1 may include a plurality of concave portions. The first pattern P1 may include a plurality of concave portions spaced apart from each other. The second ink layer 620 may be a layer for implementing the second pattern P2. The second pattern P2 may include at least one convex part or convex parts connected to each other. The second pattern P2 may be disposed between the first patterns P1 or between the convex portions. The first ink layer 610 and the second ink layer 620 may be layers of the same material or layers of different materials. The second pattern P2 may be disposed on the upper surface of the resin layer 400 and may not be formed on the side surface. The second pattern P2 or the second ink layer 620 may be disposed on the upper surface of the phosphor layer 500 and may not be formed on side surfaces of the phosphor layer 500. The second pattern P2 or the second ink layer 620 may not be formed on side surfaces of the phosphor layer 500 or the resin layer 400. The side surface of the ink layer 600 may be formed in a flat plane without the convex portion. When viewed from the outside, the three-dimensional image from the side of the phosphor layer 500 or the resin layer 400 may not have a significant effect.

As shown in FIG. 3, the height h1 of the upper surface of the first ink layer 610 may be lower than the height h2 of the upper surface of the second ink layer 620. The height h1 of the upper surface of the first ink layer 610 may be greater than or equal to ⅕ of the height h2 of the upper surface of the second ink layer 620 and smaller than the height h2. The height h1 of the first ink layer 610 may be at least 0.2 mm. The height h2 of the second ink layer 620 may be 1 mm or less, for example, 0.5 mm to 1 mm. When the height h1 of the first ink layer 610 is less than ⅕ of the height h2 of the second ink layer 620, the height h1 of the first ink layer 610 is considerably low, the external so when viewed from, it becomes difficult to express the color of red. The height h1 of the first ink layer 610 may be a height from the lower surface of the ink layer 600 to the upper surface of the concave portion. The height h2 of the upper surface of the second ink layer 620 may be a height from the lower surface of the ink layer 600 to the upper surface of the convex portion. The height h1 of the first ink layer 610 may be the height of the bottom of the concave portion. The height h2 of the second ink layer 620 may be the height of the upper surface of the convex portion. The height h1 may be the minimum thickness in the ink layer 600, and the height h2 may be the maximum thickness in the ink layer 600.

The height h2 of the upper surface of the second ink layer 620 may correspond to the height h3 of the phosphor layer 500. The height h3 of the phosphor layer 500 may be 0.5 mm or more, for example, in a range of 0.5 mm to 1 mm. Accordingly, the height h1 of the first ink layer 610 may be ⅕ or more of the height h3 of the phosphor layer 500. In the drawings, the width of the first ink layer 610 is formed to be smaller than the width of the second ink layer 620, but this is only an example for implementing the pattern P according to the embodiment, and it may be formed in various widths depending on the shape of the pattern P. That is, the width of the concave portion in the horizontal direction may be greater than the width of the convex portion, and conversely, the width of the concave portion may be smaller than the width of the convex portion. The upper surface 610a of the first ink layer 610 may be disposed parallel to the lower surface of the first ink layer 610 or the lower surface of the ink layer 600. The upper surface 610a of the first ink layer 610 may be disposed parallel to the upper surface 620a of the second ink layer 620. Upper surfaces of the concave portions may be parallel to upper surfaces of the convex portions. Since the upper surface 610a of the first ink layer 610 has a flat structure, light emitted through the first ink layer 610 may have the same luminance. The upper surface of the phosphor layer 500 may be parallel to the lower surface of the ink layer 600. The upper surface of the phosphor layer 500 may be in contact with the lower surface of the ink layer 600. By providing different heights of the exposed upper surfaces of the plurality of ink layers 610 and 620, a three-dimensional image is provided when not lit, and a three-dimensional effect may be adjusted according to the luminance level when light is lit.

Referring to FIGS. 4 and 5, the first ink layer 610 may include a region for forming the first pattern P1. The second ink layer 620 may be a region for forming the second pattern P2. When the light source 200 is turned on, the first pattern P1 and the second pattern P2 realize a red image. Since the height of the first ink layer 610 is lower than that of the upper surface of the second ink layer 620, the amount of blocking light emitted from the phosphor layer 500 is reduced. That is, as the height of the ink layer 600 increases, the amount of blocking light increases. That is, as the thickness of the ink layer 600 increases, the amount of blocking light increases. Accordingly, the luminance of the light emitted through the concave portion of the first ink layer 610 may be higher than the luminance of the light emitted through the second ink layer 620, that is, the convex portion. That is, the luminance of the light emitted from the concave portion of the first ink layer 610 may be provided in a bright red pattern, and the luminance of the second ink layer 620 may be provided in a dark red pattern than the luminance of the first ink layer 610. The first pattern P1 and the second pattern P2 may be provided as a red image having a difference in luminance when the light is lit. When the luminance of light emitted from the light source 200 is at a low level, for example, 10 candela or less, the boundary between the first pattern P1 and the second pattern P2 is clearly visible or separated. Here, 10 candela is a luminance range of light emitted in the tail mode. In addition, when the luminance of the light emitted from the light source 200 is at a high level, for example, 60 candela or more, the boundary between the first pattern P1 and the second pattern P2 may not be visible or may not be distinguished. Here, 60 candela is a luminance range of light emitted in the stop mode. At the low level, the difference in brightness the light emitted through the concave portion and the second ink layer 620 may be greater than the brightness difference the light emitted through the concave portion and the light emitted through the second ink layer 620 at the high level. have. In the first driving mode, the luminance difference may be large at the boundary between the first pattern P1 and the second pattern P2, and in the second driving mode, the luminance difference may be small at the boundary between the first pattern P1 and the second pattern P2. That is, in the tail mode, since the boundary between the first pattern P1 and the second pattern P2 is clearly distinguished, in the tail mode, an image of illumination may be provided. In the stop mode, since the image of the light is not implemented, only the red color may be shown to the driver without the image, and safe driving may be induced.

Figure 6:
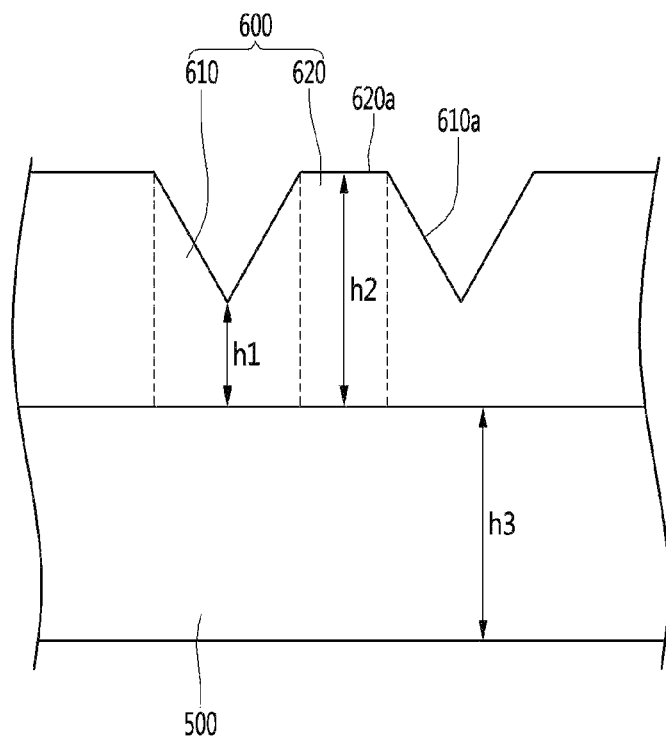
FIGS. 6 to 8 are cross-sectional views showing modified examples of the ink layer according to the embodiment of the invention.
Figure 7:
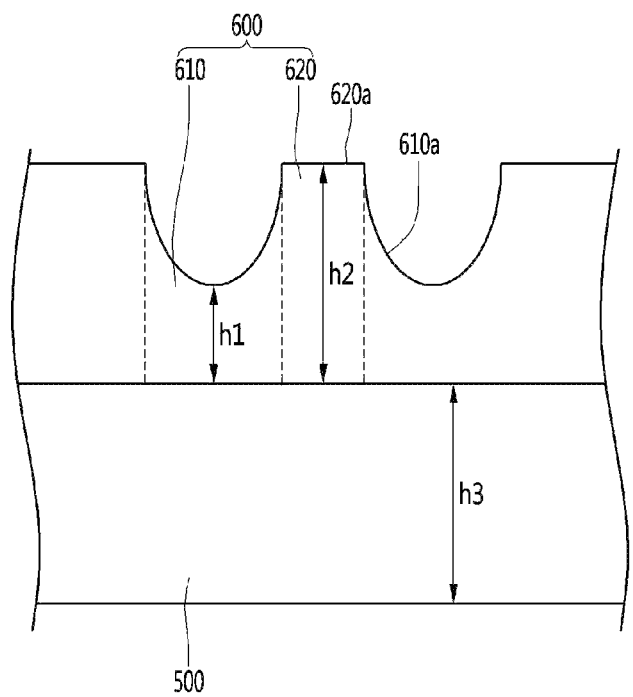
Figure 8:
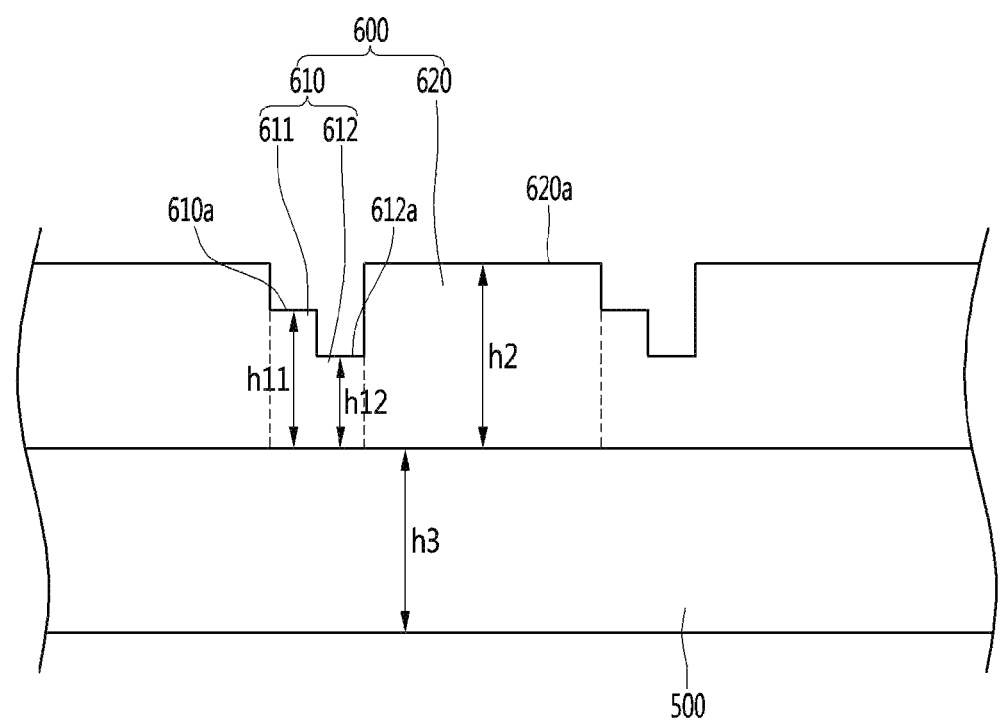

FIGS. 6 to 8 are cross-sectional views showing modified examples of the ink layer of the invention. The modified example may optionally include a description of the embodiment disclosed above.

Referring to FIG. 6, an ink layer 600 according to a modified example of the embodiment may have a structure including concave portions and convex portions. The ink layer 600 may include a first ink layer 610 and a second ink layer 620. The height h1 of the lowest region among the regions of the first ink layer 610 may be smaller than the height h2 of the upper surface of the second ink layer 620. The height h1 of the lowest region of the first ink layer 610 may be ⅕ or more of the height h2 of the upper surface of the second ink layer 620. The height h1 of the first ink layer 610 may be at least 0.2 mm. The height h1 of the first ink layer 610 may be formed to be higher toward the second ink layer 620. The height h1 of the first ink layer 610 may be the highest in a region adjacent to the convex portion, and may be smaller in a region farther from the convex portion. One end or edge of the concave portion in the first ink layer 610 may have the same height as the upper surface of the second ink layer 620. The upper surface 610a of the first ink layer 610, that is, the bottom of the concave portion may be inclined from the upper surface 620a of the second ink layer 620. The upper surface 610a of the first ink layer 610 may include at least one inclined surface. The upper surface 610a of the first ink layer 610 may have two inclined surfaces forming a predetermined angle or symmetrically formed at the center of the concave portion. The inclined surface may be inclined at a predetermined angle to the upper surface 620a of the second ink layer 620. The upper surface 610a of the first ink layer 610, that is, the bottom of the concave portion may have a structure that becomes deeper toward the center of the first ink layer 610 or the center of the concave portion. Although it is illustrated that the upper surface 610a of the first ink layer 610 or the bottom of each concave portion is formed of two inclined surfaces, it may have one inclined surface or three or more inclined surfaces. Since the upper surface 610a of the first ink layer 610 is formed as an inclined surface, it is possible to implement a gradation effect in the image of illumination. From this, the overall image may be implemented more smoothly, improving the aesthetic sense. The upper surface height h2 of the second ink layer 620 may be 1 mm or less, for example, 0.5 mm to 1 mm. When the height h1 of the first ink layer 610 is less than ⅕ of the upper surface height h2 of the second ink layer 620, the height of the first ink layer 610 is significantly lowered when viewed from the outside, it becomes difficult to express the color of red. The height h2 of the upper surface of the second ink layer 620 may be the same as the height h3 of the phosphor layer 500. The height h3 of the phosphor layer 500 may be 0.5 mm or more, for example, 0.5 mm to 1 mm. Accordingly, the height h1 of the first ink layer 610 may be ⅕ or more of the height h3 of the phosphor layer 500. In the drawings, the width of the first ink layer 610 is formed to be smaller than the width of the second ink layer 620, but this is only an example for implementing the pattern according to the embodiment, and various widths may be set according to the pattern shape.

As shown in FIG. 7, the ink layer 600 according to a modified example of the invention may have a structure including a concave portion and a convex portion. The ink layer 600 may include a first ink layer 610 and a second ink layer 620. The upper surface height h1 of the first ink layer 610 may be lower than the upper surface height h2 of the second ink layer 620. The height h1 of the lowest region of the first ink layer 610 may be ⅕ or more of the height h2 of the upper surface of the second ink layer 620. The height h1 of the first ink layer 610 may be at least 0.2 mm. The height h1 of the first ink layer 610 may be formed to be higher toward the second ink layer 620. The height h1 of the first ink layer 610 may be the highest in a region adjacent to the convex portion, and may be smaller in a region farther from the convex portion. One end or edge of the first ink layer 610 may have the same height as the upper surface of the second ink layer 620. The upper surface 610a of the first ink layer 610 may be inclined from the upper surface 620a of the second ink layer 620 or may include a curved surface having a curvature. The upper surface 610a of the first ink layer 610 may include at least one curved surface. A straight line connected from a high point to a low point of the ink layer 600 may be inclined at a predetermined angle. The upper surface 610a of the first ink layer 610 or a bottom of the concave portion may have a structure that becomes deeper toward the center of the first ink layer 610, that is, the center of the concave portion. The upper surface 610a may include a concave curved surface. The curved shape may include a hemispherical shape. Since the upper surface 610a of the first ink layer 610 is formed in a curved surface, a gradation effect may be implemented in the image of the illumination. From this, the overall image may be implemented more smoothly, thereby improving the aesthetics.

The height h2 of the second ink layer 620 may be 1 mm or less, for example, 0.5 mm to 1 mm. When the height h1 of the first ink layer 610 is less than ⅕ of the height h2 of the second ink layer 620, the height of the first ink layer 610 is significantly lowered and when viewed from the outside, it becomes difficult to express the color of red. The height h2 of the second ink layer 620 may correspond to the height h3 of the phosphor layer 500. The height h3 of the phosphor layer 500 may be 0.5 mm or more, for example, 0.5 mm to 1 mm. Accordingly, the height h1 of the first ink layer 610 may be ⅕ or more of the height h3 of the phosphor layer 500. In the drawings, the width of the first ink layer 610 is formed to be smaller than the width of the second ink layer 620, but this is only an example for implementing the pattern according to the embodiment, and a range of the width of the first ink layer 610 may be established variously vary according to the pattern shape.

As shown in FIG. 8, the ink layer 600 according to the modified example of the embodiment may have a structure including a concave portion and a convex portion. The ink layer 600 may include a first ink layer 610 and a second ink layer 620. The first ink layer 610 may include a plurality of layers having different heights. For example, the first ink layer 610 may include a first-first ink layer 611 and a first-second ink layer 612. The first-first ink layer 611 may be disposed between the second ink layer 620 and the first-second ink layer 612 or may be adjacent to at least one of the second ink layer 620 and the first-second ink layer 612. The first-second ink layer 612 may be disposed between the first-first ink layer 611 and the second ink layer 620 or may be adjacent to at least one of the second ink layer 620 and the first-second ink layer 612. The first ink layer 610 may include a plurality of concave portions. The first ink layer 610 may include the concave portions having a stepped structure. The first ink layer 610 may have a stepped structure in a horizontal direction. An upper surface height h11 of the first-first ink layer 611 may be higher than an upper surface height h12 of the first-second ink layer 612. The upper surface height h11 of the first-first ink layer 611 may be formed to be lower than the upper surface height h2 of the second ink layer 620. The upper surface height h12 of the first-second ink layer 612 may be formed to be at least 0.2 mm or more. For this reason, the ink layer 600 has three layers, for example, the first-first ink layer 611, the first-second ink layer 612, and the second ink layer 620, and the image may be implemented by three colors. The width of the first-first ink layer 611 and the width of the first-second ink layer 620 in the horizontal direction may be the same or different from each other. The widths of the first-first ink layer 611 and the first-second ink layer 612 in the horizontal direction may be variously formed according to the shape of the pattern. The first-first ink layer 611 and the first-second ink layer 612 may be disposed in the concave portion.

An upper surface of the first-first ink layer 611 may be formed parallel to an upper surface of the second ink layer 612. The upper surface of the first-first ink layer 611 may be formed parallel to the upper surface of the first-second ink layer 612. When the first-first ink layer 611 is the first concave portion and the first-second ink layer 612 is the second concave portion, the upper surfaces of the first concave portions may be parallel to the upper surfaces of the second concave portions. The upper surfaces of the first concave portions and the upper surfaces of the second concave portions may be parallel to upper surfaces of the convex portions. The concave portion may include a plurality of bottom surfaces having different heights.

The upper surface of the first-first ink layer 611 may be disposed at a higher position than the upper surface of the first-second ink layer 612. The upper surface of the first-first ink layer 611 may be formed at a lower position than the upper surface of the second ink layer 620. The upper surface height h2 of the second ink layer 620 may be 1 mm or less, for example, 0.5 mm to 1 mm. When the upper surface height h12 of the first-second ink layer 612 is less than ⅕ of the upper surface height h2 of the second ink layer 620, the upper surface height of the first-second ink layer 612 is significantly lowered and when viewed from the outside, it becomes difficult to express the color of red. The height h2 of the upper surface of the second ink layer 620 may be the same as the height h3 of the phosphor layer 500. The height h3 or thickness of the phosphor layer 500 may be 0.5 mm or more, for example, 0.5 mm to 1 mm. Accordingly, the height h12 of the upper surface of the first-second ink layer 612 may be formed to be ⅕ or more of the height h3 of the phosphor layer 500. In the drawings, the width of the first ink layer 610 is formed to be smaller than the width of the second ink layer 620, but this is only an example for implementing the pattern according to the embodiment, and various widths may be set according to the pattern shape. The modified example has the effect of effectively implementing more various patterns to implement three or more different colors. Alternatively, two or three or more layers having different inks are disposed at different heights in the vertical direction, thereby giving a stereoscopic effect of an image having a predetermined shape. Here, the ink powders of the first and second ink layers may be the same or different from each other, and the outer image may be provided as a three-dimensional image using a stepped structure or a difference in depth. The ink powders in the first and second layers of the first ink layer may be the same or different from each other, and the image of the entire surface may be provided with a three-dimensional image by using a stepped structure or a difference in depth. When the ink powder in the first and second ink layers is the same material, the ink layer may include a concave portion having a first height and a convex portion convex outside the concave portion.

Figure 9:
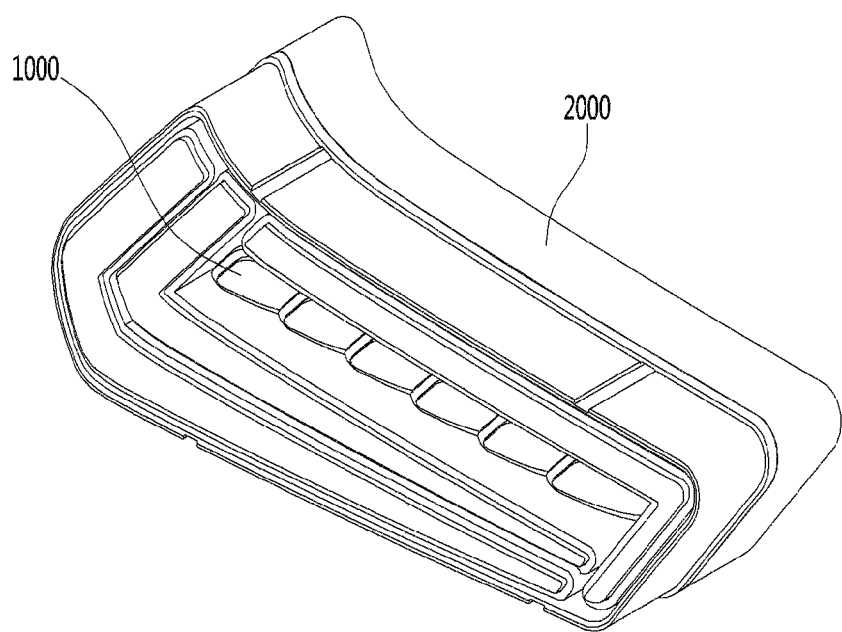
FIG. 9 is a schematic perspective view illustrating a rear lamp for a vehicle having a lighting device according to an embodiment of the invention.

FIG. 9 is a schematic perspective view illustrating a rear lamp for a vehicle having a lighting device according to an embodiment of the invention. As shown in FIG. 9, the vehicle lamp may include a rear panel 2000 and a plurality of lighting devices 1000 coupled to the rear panel 2000. Here, the lighting device 1000 may be the module disclosed above. The lighting device 1000 may be installed in the tail-brake lamp region and the turn signal lamp region. The lighting device 1000 disposed in the tail-brake lamp region may serve as a tail light for informing a rear vehicle of its location when driving at night. In addition, the lighting device 1000 may serve as a stop light informing that the vehicle is decelerating from the rear vehicle. The lighting device 1000 disposed in the turn signal lamp region serves as a signal function and serves to inform other vehicles of the direction the vehicle intends to go. A connection part may be formed in the rear panel 2000 to be connected to the lighting device 1000. The connection part may be configured separately from the rear panel, or may be formed integrally with the rear panel 2000. The lighting device 1000 coupled to the rear panel 2000 may be coupled to the rear panel or the connection unit in a sliding manner. For example, a terminal of a substrate may be exposed in the lighting device 1000, and a contact terminal electrically connected to the terminal of the substrate may be formed in the rear panel 2000 or a connection portion corresponding thereto. Although the vehicle lamp has been described as an embodiment of the vehicle rear lamp, the invention is not limited thereto, and may include other lamp structures such as a vehicle front lamp or a mood lamp.

The invention claimed is:
1. A lighting device comprising:
a substrate;
a plurality of light sources disposed on the substrate;
a resin layer disposed on the substrate and the plurality of light sources;
a phosphor layer disposed on the resin layer; and
an ink layer disposed on the phosphor layer;
wherein the ink layer has a first ink layer disposed on the phosphor layer and a second ink layer having an upper height higher than an upper height of the first ink layer with respect to an upper surface of the phosphor layer, and
wherein the first ink layer includes a first-first ink layer on the phosphor layer and a first-second ink layer having an upper height smaller than an upper height of the first-first ink layer with respect to the upper surface of the phosphor layer.
2. The lighting device of claim 1, wherein a height of the first ink layer on a lower surface of the ink layer is ⅕ or more of a height from the lower surface of the ink layer to an upper surface of the second ink layer.
3. The lighting device of claim 2, wherein an upper surface of the ink layer is inclined with respect to the upper surface of the second ink layer.
4. The lighting device of claim 2, wherein an upper surface of the ink layer includes a curved surface.
5. The lighting device of claim 1, wherein a thickness of the ink layer is a same as a thickness of the phosphor layer, and
wherein the thickness of the ink layer is a height from a lower surface of the ink layer to an upper end of the second ink layer.
6. The lighting device of claim 1, wherein widths of the first-first ink layer, the first-second ink layer, and the second ink layer are different from each other.
7. The lighting device of claim 1, wherein the first ink layer implements a light in a first pattern by light emitted from the plurality of light sources, and the second ink layer implements a light in a second pattern different from a shape of the first pattern,
when a luminance of the light is 10 candela or less, a brightness of a region of the first pattern is brighter than a brightness of a region of the second pattern, and
when a luminance of the light is 60 candela or more, the brightness of the region of the first pattern corresponds to the brightness of the region of the second pattern.
8. The lighting device of claim 1, wherein the first ink layer and the second ink layer are formed of a same material.
9. A lighting device comprising:
a substrate;
a plurality of light sources disposed on the substrate;
a resin layer disposed on the substrate and the plurality of light sources;
a phosphor layer disposed on the resin layer; and
an ink layer disposed on an upper surface and a plurality of side surfaces of the phosphor layer,
wherein the ink layer includes a first ink layer disposed on the upper surface and the plurality of side surfaces of the phosphor layer and a second ink layer disposed between regions of the first ink layer, and
wherein the first ink layer includes regions having different heights from a center of the ink layer toward an upper end of the second ink layer based on the upper surface of the phosphor layer.
10. The lighting device of claim 9, wherein a height of the first ink layer on the upper surface of the phosphor layer is ⅕ or more of a height of the second ink layer on the upper surface of the phosphor layer,
wherein side surfaces of the ink layer extend to each of the side surfaces of the phosphor layer and have a flat plane.
11. The lighting device of claim 9, wherein an area of an upper surface of the second ink layer is smaller than an area of a lower surface of the first ink layer.
12. The lighting device of claim 9, wherein the first ink layer and the second ink layer are formed of a same material.
13. A lighting device comprising:
a substrate;
a plurality of light sources disposed on the substrate;
a resin layer disposed on the substrate and the plurality of light sources;
a phosphor layer disposed on the resin layer; and
an ink layer disposed on an upper surface of the phosphor layer,
wherein the ink layer has a plurality of concave portions recessed from an upper surface toward a lower surface of the ink layer, and
wherein the plurality of concave portions of the ink layer is spaced apart from the lower surface of the ink layer.
14. The lighting device of claim 13, wherein the ink layer includes a first ink layer disposed on the upper surface of the phosphor layer and a second ink layer disposed between regions of the first ink layer.
15. The lighting device of claim 14, wherein the first ink layer is disposed between the plurality of concave portions and the phosphor layer.
16. The lighting device of claim 14, wherein the second ink layer is disposed between the plurality of concave portions, and
wherein upper surfaces of the second ink layer disposed between the regions of the first ink layer have a same height.
17. The lighting device of claim 14, wherein upper surfaces of the first ink layer have different heights.

18. The lighting device of claim 17, wherein the first ink layer and the second ink layer are formed of a same material.

19. The lighting device of claim 13, wherein at least one of the plurality of concave portions has different depths in the upper surface of the ink layer.

20. The lighting device of claim 13, wherein an area of the upper surface of the ink layer is smaller than an area of the lower surface of the ink layer.

* * * * *